United States Patent
Dai et al.

(10) Patent No.: US 10,126,384 B2
(45) Date of Patent: Nov. 13, 2018

(54) RECEIVER OF MAGNETIC RESONANCE SYSTEM AND MAGNETIC RESONANCE SYSTEM

(71) Applicants: Guang Bao Dai, Shenzhen (CN); Lan Wang, Shenzhen (CN); Zhi Bin Li, Shenzhen (CN)

(72) Inventors: Guang Bao Dai, Shenzhen (CN); Lan Wang, Shenzhen (CN); Zhi Bin Li, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 874 days.

(21) Appl. No.: 14/666,535

(22) Filed: Mar. 24, 2015

(65) Prior Publication Data

US 2015/0276899 A1 Oct. 1, 2015

(30) Foreign Application Priority Data

Mar. 28, 2014 (CN) .......................... 2014 1 0123682

(51) Int. Cl.
 *G01R 33/36* (2006.01)
 *G01R 33/54* (2006.01)
(52) U.S. Cl.
 CPC ..... *G01R 33/3621* (2013.01); *G01R 33/3664* (2013.01); *G01R 33/543* (2013.01)
(58) Field of Classification Search
 CPC ............ G01R 33/3621; G01R 33/3415; G01R 33/54; G01R 33/3664; G01R 33/543
 See application file for complete search history.

(56) References Cited

U.S. PATENT DOCUMENTS

| 6,448,770 B1* | 9/2002 | Liu ..................... G01R 33/3621 324/307 |
| 7,173,427 B1* | 2/2007 | Adachi ............. G01R 33/3621 324/318 |
| 2009/0286478 A1 | 11/2009 | Biber et al. |
| 2010/0001725 A1 | 1/2010 | Van Liere |
| 2014/0361775 A1* | 12/2014 | Qiu .................... G01R 33/3664 324/309 |

FOREIGN PATENT DOCUMENTS

CN 103513196 1/2014

\* cited by examiner

*Primary Examiner* — Rishi Patel
(74) *Attorney, Agent, or Firm* — Lempia Summerfield Katz LLC

(57) ABSTRACT

A receiver of a magnetic resonance imaging system and a magnetic resonance imaging system are provided. The receiver includes a receiving end for receiving an analog magnetic resonance signal from a local coil of the magnetic resonance imaging system, a sending end for sending a digital magnetic resonance signal to an image reconstruction apparatus of the magnetic resonance imaging system, at least two digital processing channels connected to the sending end for digitizing the analog magnetic resonance signal to the digital magnetic resonance signal, and a channel selection unit connected between the digital processing channels and the receiving end for selecting a corresponding digital processing channel from the digital processing channels according to type information about the local coil. The embodiments may be compatible with many types of local coils without re-designing the local coils, which significantly reduces the cost of the system.

15 Claims, 5 Drawing Sheets

RECEIVER OF MAGNETIC RESONANCE SYSTEM AND MAGNETIC RESONANCE SYSTEM

CROSS-REFERENCE TO RELATED APPLICATIONS

This application claims the benefit of CN 201410123682.5, filed on Mar. 28, 2014, which is hereby incorporated by reference in its entirety.

TECHNICAL FIELD

The present embodiments relate to the technical field of magnetic resonance imaging, and particularly to a receiver of a magnetic resonance imaging system and a magnetic resonance imaging system.

BACKGROUND

Magnetic resonance imaging (MRI) is a bio-magnetic nuclear spin imaging technology developed rapidly along with the development of computer technology, electronic circuit technology, and superconductor technology. MRI uses a magnetic field and a radio frequency pulse to make hydrogen nuclei (H+) of precession in human tissues vibrate to produce a radio frequency signal, and form an image after computer processing. When an object is placed in the magnetic field, the object is irradiated by an appropriate electromagnetic wave so as to make it resonate, then the electromagnetic wave released thereby is analyzed, and the location and type of the nuclei constituting the object may be known, whereby a precise stereoscopic image of the interior of the object may be drawn. For example, an animation of consecutive slices may be obtained by scanning the human brain through magnetic resonance imaging, starting from the head to the foot.

In a MRI system, a transmitting coil transmits a radio frequency pulse to realize magnetic resonance. A local coil receives an analog magnetic resonance signal and sends the analog magnetic resonance signal to a reception coil channel selector (RCCS) and a receiver. The analog magnetic resonance signal is digitized in the receiver. An image reconstruction apparatus uses a digital magnetic resonance signal to reproduce an image.

Currently, there are many types of local coils and corresponding receivers. For example, the patent document with publication number CN103513196A discloses a magnetic resonance receiver and a reception signal processing method and apparatus thereof. The magnetic resonance receiver of the technical solution includes at least two paths of reception channels and at least two analog-to-digital conversion circuits and reception signal processing apparatuses. Besides, the reception signal processing apparatus includes (1) at least two groups of switch units, respectively corresponding to an analog-to-digital conversion circuit, (2) a control unit for controlling the connection of the switch units and the connection of the analog-to-digital conversion circuit, and (3) a composition unit for adding digital signals output from the analog-to-digital conversion circuit that is connected to a working channel.

However, this type of receiver may merely receive a magnetic resonance signal from a certain type of local coil, and may not be compatible with a plurality of types of local coils. If the receiver is required to support other types of local coils, the local coils need to be re-designed, which significantly improves the cost of the system.

SUMMARY AND DESCRIPTION

The scope of the present invention is defined solely by the appended claims and is not affected to any degree by the statements within this summary. The present embodiments may obviate one or more of the drawbacks or limitations in the related art.

The embodiments of propose a receiver of a magnetic resonance imaging system to reduce costs.

The embodiments propose a magnetic resonance imaging system to reduce costs.

The technical solution of the embodiments is as follows. A receiver of a magnetic resonance imaging system includes (1) a receiving end for receiving an analog magnetic resonance signal from a local coil of the magnetic resonance imaging system, (2) a sending end for sending a digital magnetic resonance signal to an image reconstruction apparatus of the magnetic resonance imaging system, (3) at least two digital processing channels connected to the sending end for digitizing the analog magnetic resonance signal to the digital magnetic resonance signal, and (4) a channel selection unit connected between the digital processing channels and the receiving end for selecting a corresponding digital processing channel from the digital processing channels according to type information about the local coil.

The channel selection unit is further connected to a control unit of the magnetic resonance imaging system for acquiring the type information from the control unit.

The channel selection unit is a toggle switch, and the toggle switch turns on the corresponding digital processing channel according to the type information.

The digital processing channels include a radio frequency signal digital processing channel and/or an intermediate frequency signal digital processing channel.

The digital processing channels include a radio frequency signal digital processing channel and an intermediate frequency signal digital processing channel, and the channel selection unit includes a band pass filter connected to the radio frequency signal digital processing channel, and a low pass filter connected to the intermediate frequency signal digital processing channel.

In an additional embodiment, a gain adjustable amplifier is provided for amplifying the analog magnetic resonance signal.

The gain adjustable amplifier is connected between the receiving end and the channel selection unit.

The gain adjustable amplifier adjusts a gain coefficient of the gain adjustable amplifier according to the type information.

The gain adjustable amplifier is connected to a control unit of the magnetic resonance imaging system for acquiring the type information from the control unit.

In certain embodiments, a magnetic resonance imaging system is provided, wherein the system includes the receiver as described above.

It may be seen from the above-mentioned technical solution that the receiver of the magnetic resonance imaging system of the embodiments includes (1) a receiving end for receiving an analog magnetic resonance signal from a local coil of the magnetic resonance imaging system, (2) a sending end for sending a digital magnetic resonance signal to an image reconstruction apparatus of the magnetic resonance imaging system, (3) at least two digital processing channels connected to the sending end for digitizing the analog magnetic resonance signal to the digital magnetic resonance signal, and (4) a channel selection unit connected between the digital processing channels and the receiving end for selecting a corresponding digital processing channel from the digital processing channels according to type information about the local coil. It may be seen that after the embodiments are applied, the receiver may be compatible with many types of local coils without re-designing the local coils, which significantly reduces the cost of the system.

Besides, the embodiments respectively perform first amplification and secondary amplification on an analog magnetic resonance signal of a reception coil of type 1 at a receiver side so as to compensate large attenuation in the transmission process of radio frequency signals well. Besides, for an analog magnetic resonance signal of a local coil of type 2, the embodiments perform signal separation after performing digitization processing instead of performing signal separation in an analog stage so as to reduce the cost of an analog circuit. In addition, the embodiments may further reduce the amount of digital processing channels by multiplexing an element.

DETAILED DESCRIPTION

In order to make the technical solution and advantages more apparent, the present embodiments will be further described in detail in conjunction with the accompanying drawings.

For the purpose of brief and intuitive description, the following describes the solution by describing several representative embodiments. A multitude of details in the embodiments are merely used to help to understand the solution. The realization of the technical solution may not be limited to these details. In order to avoid obscuring the solution unnecessarily, some embodiments are not described in detail, but merely a framework is given. Hereinafter, "comprising" denotes "comprising but not limited to", and "according to . . . " denotes "at least according to . . . , but not limited to merely according to . . . ." When the quantity of a component is not pointed out particularly hereinafter, it provides that the component may be one, and also may be of a plurality, or may be understood as at least one.

Figure 1:
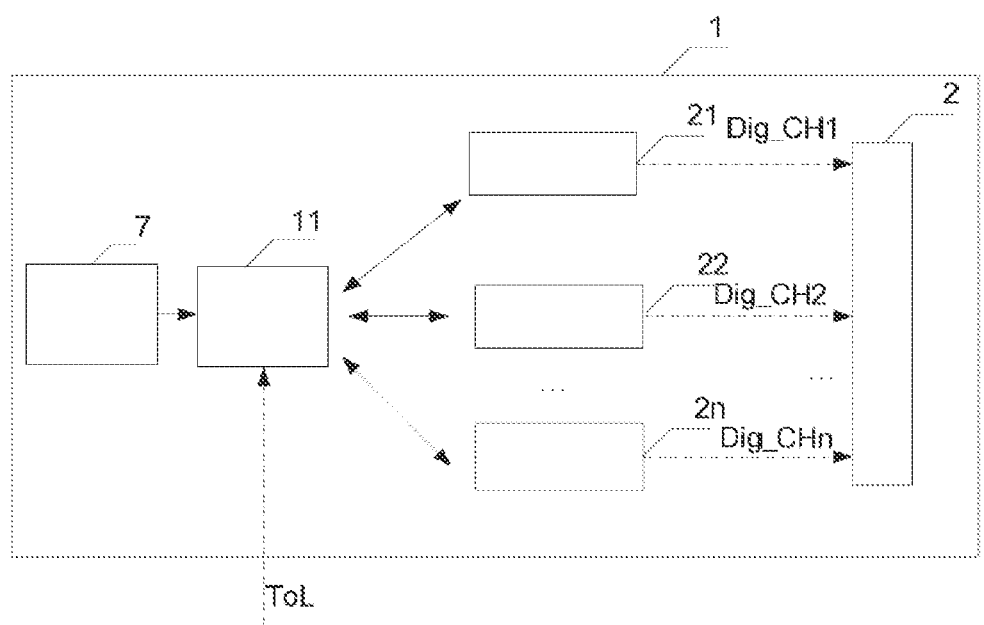
FIG. 1 is a structural diagram of an embodiment of a receiver of a magnetic resonance imaging system.

FIG. 1 is a structure diagram of a receiver of a magnetic resonance imaging system. As depicted in FIG. 1, a receiver 1 includes a receiving end 7 for receiving an analog magnetic resonance signal from a local coil of a magnetic resonance imaging system. The receiver further includes a sending end 2 for sending a digital magnetic resonance signal to an image reconstruction apparatus of the magnetic resonance imaging system. The receiver further includes a plurality of digital processing channels 21, 22 . . . 2n, where n is a positive integer that is at least 2. The receiver further includes connected to the sending end 2 for digitizing the analog magnetic resonance signal to the digital magnetic resonance signal. The receiver further includes a channel selection unit 11 connected between the digital processing channels 21, 22 . . . 2n and the receiving end 7 for selecting a corresponding digital processing channel from the digital processing channels 21, 22 . . . 2n according to type information (ToL) about the local coil, wherein the determined digital processing channel is used for performing digitization processing on an analog magnetic resonance signal received from the local coil.

Particularly, when the digital processing channels 21, 22 . . . 2n are respectively selected by the channel selection unit 11, digitization processing is performed respectively on the analog magnetic resonance signal received from the local coil corresponding to respective type information, and the output of the digital magnetic resonance signal thereof is respectively Dg_CH1, Dg_CH2 and Dg_CHn. The sending end 2 sends the digital magnetic resonance signals Dg_CH1, Dg_CH2 and Dg_CHn to an image reconstruction apparatus of the magnetic resonance imaging system.

In the embodiments, there is a correlation between the digital processing channel and the type of the local coil. There may be many types of local coils. Accordingly, there may be a plurality of digital processing channels.

For example, the local coil may not contain a frequency mixing processing unit, and an analog magnetic resonance signal transmitted by the local coil is a radio frequency signal. At this moment, for the analog magnetic resonance signal of the local coil not containing the frequency mixing processing unit, the digital processing channel may have an amplifier with a high power so as to amplify large attenuation caused by the cable transmission of the radio frequency signal.

The local coil may also contain a frequency mixing processing unit, and an analog magnetic resonance signal transmitted after the processing of the frequency mixing processing unit is an intermediate frequency signal. At this moment, since the intermediate frequency signal is not attenuated much during cable transmission, the digital processing channel corresponding to the local coil containing the frequency mixing processing unit may have an amplifier with a low power.

Herein the radio frequency signal is a signal received from the receiving end 7 before frequency mixing. The radio frequency signal becomes an intermediate frequency signal after frequency mixing down-converts to an intermediate frequency band (for example, a frequency band range is approximately 3000 KHz).

The local coil may be particularly implemented as a body coil, a head coil, a neck coil, etc. The above describes particular embodiments of the local coil in detail, and a person skilled in the art may realize that the list is merely exemplary, and is not used to limit the local coil.

The digital processing channels may include a radio frequency signal digital processing channel and/or an intermediate frequency signal digital processing channel.

In one embodiment, the radio frequency signal digital processing channel successively includes an amplifier, a band pass filter, an A/D converter, as well as a digital down-converter. The amplifier amplifies a received radio frequency analog magnetic resonance signal; the band pass filter filters the amplified radio frequency analog magnetic resonance signal; the A/D converter converts the filtered radio frequency analog magnetic resonance signal into a digital magnetic resonance signal; and the digital down-converter performs digital down-conversion processing on the digital magnetic resonance signal.

In one embodiment, the intermediate frequency signal digital processing channel successively includes a low pass filter, an A/D converter, and a digital down-converter. The low pass filter performs low pass filtering on a received intermediate frequency analog magnetic resonance signal; the A/D converter converts the filtered intermediate frequency analog magnetic resonance signal into a digital magnetic resonance signal; and the digital down-converter performs digital down-conversion processing on the digital magnetic resonance signal.

Based on the changes of various application environments and requirements, electronic components in the radio frequency signal digital processing channel and the intermediate frequency signal digital processing channel may change accordingly, and this is not limited in the embodiments.

In the embodiments, local coils of the same type are provided with the same type information.

For example, type information about each local coil may be stored therein. When the local coil is connected to a magnetic resonance imaging system (for example, inserted into a slot of a patient bed), a control unit of the magnetic resonance imaging system may acquire the type information from the local coil. The channel selection unit 11 may acquire the type information from the control unit of the magnetic resonance imaging system so as to be able to determine a digital processing channel corresponding to the local coil based on the type information.

For another example, type information about each local coil may be stored therein. When the local coil is connected to a magnetic resonance imaging system (for example, inserted into a slot of a patient bed), the local coil may send type information thereof to the channel selection unit 11 in a wired or wireless communication manner. The channel selection unit 11 may receive the type information from the local coil so as to be able to determine a digital processing channel corresponding to the local coil based on the type information.

In one embodiment, the channel selection unit 11 may be particularly implemented as a toggle switch for toggling among the plurality of digital processing channels 21, 22 . . . 2n based on type information about the local coil.

In one embodiment, the digital processing channels include a radio frequency signal digital processing channel and an intermediate frequency signal digital processing channel, and the channel selection unit 11 includes a band pass filter connected to the radio frequency signal digital processing channel, and a low pass filter connected to the intermediate frequency signal digital processing channel.

Particularly, the channel selection unit 11 may also be implemented as a band pass filter and a low pass filter connected in parallel. When the local coil contains a frequency mixing processing unit, a radio frequency signal transmitted by the local coil enters an A/D converter after being filtered by the band pass filter. When the local coil does not contain a frequency mixing processing unit, an intermediate frequency signal transmitted by the local coil enters the A/D converter after being filtered by the low pass filter.

The receiver 1 may further include a gain adjustable amplifier for amplifying an analog magnetic resonance signal. The gain adjustable amplifier is connected between the receiving end 7 and the channel selection unit 11, and may adjust a gain coefficient thereof according to type information about the local coil. When it is judged that a received transmitted analog magnetic resonance signal is an intermediate frequency signal based on the type information about the local coil, and since the intermediate frequency signal is not attenuated much during cable transmission, the gain of the gain adjustable amplifier may be reduced to a first predetermined threshold. When it is judged that a received transmitted analog magnetic resonance signal is a radio frequency signal based on the type information about the local coil, and since the intermediate frequency signal is not attenuated much during cable transmission, the gain of the gain adjustable amplifier may be increased to a second predetermined threshold. The second predetermined threshold is higher than the first predetermined threshold.

In one embodiment, the gain adjustable amplifier is connected to a control unit of the magnetic resonance imaging system for acquiring type information from the control unit.

Figure 2:
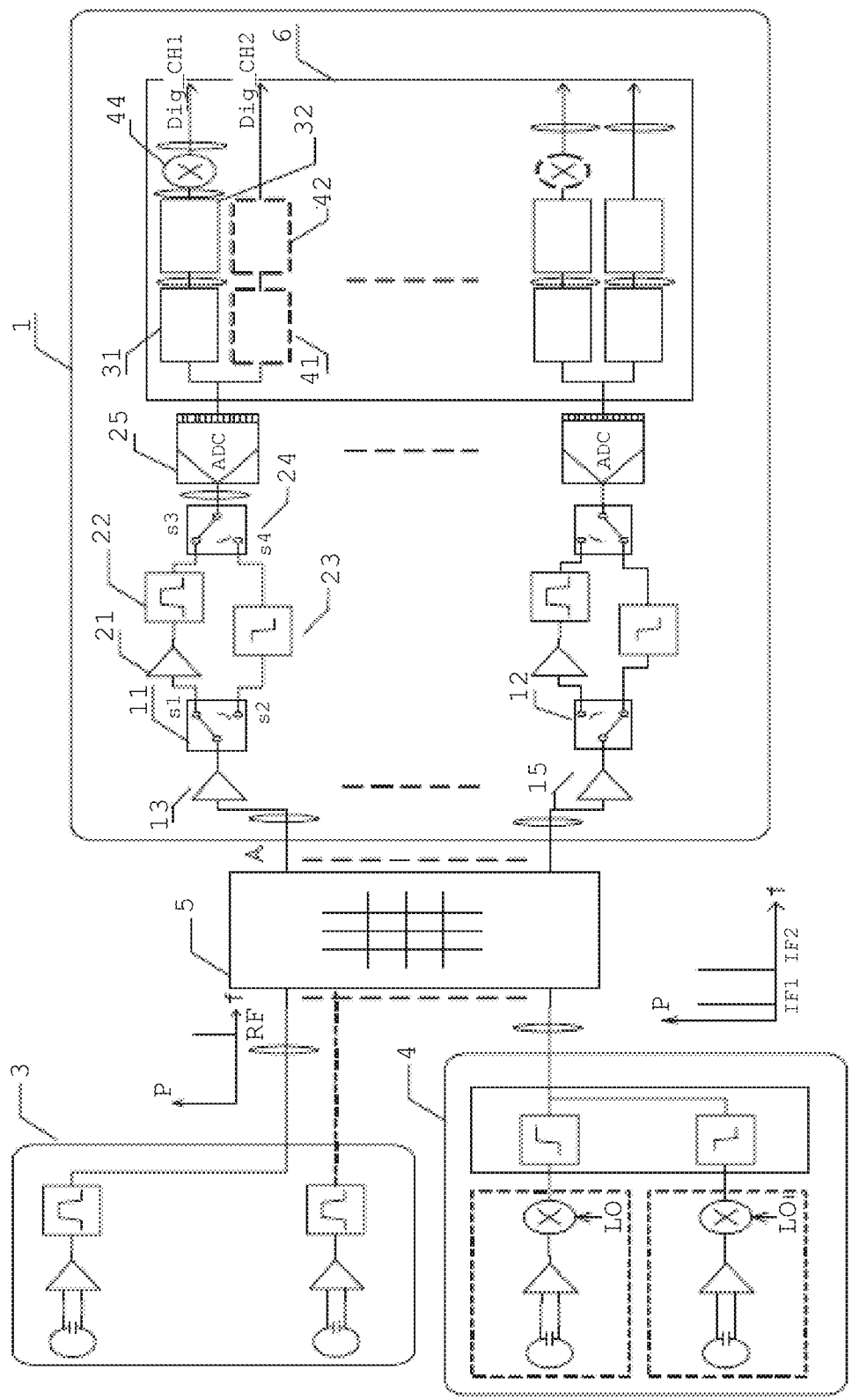
FIG. 2 is a structural diagram of a receiver of a magnetic resonance imaging system according to a first embodiment.

Based on the above-mentioned analysis, FIG. 2 is a structure diagram of a receiver of a magnetic resonance imaging system according to a first embodiment.

As depicted in FIG. 2, a local coil group 3 contains a plurality of local coils, and these local coils are of the same type and do not all contain a frequency mixing processing unit, and the analog magnetic resonance signals output by these local coils are all in radio frequency (RF), assuming that the type of each local coil in the local coil group 3 is type 1.

Besides, a local coil group 4 contains a plurality of local coils, and these local coils are of the same type and all contain a frequency mixing processing unit, and each frequency mixing processing unit respectively has a local oscillator signal input LO. The respective analog magnetic resonance signal of each local coil in the local coil group 4 is respectively frequency-mixed into an intermediate frequency (IF) by the frequency mixing unit. Besides, the respective intermediate frequency analog magnetic resonance signals (e.g., IF1 and IF2) of the plurality of local coils in the local coil group 4 are combined into a path of analog magnetic resonance signals, and the combined analog magnetic resonance signals are output to a coil channel selector 5, assuming that the type of each local coil in the local coil group 4 is type 2.

The local coil group 3 and the local coil group 4 are respectively connected to an input port of the receiving coil channel selector 5. A radio frequency signal output port is allocated for each local coil in the local coil group 3 and the local coil group 4 by the receiving coil channel selector 5. The radio frequency signal output port corresponds to the local coil.

When the local coil group 3 and the local coil group 4 are connected to a magnetic resonance imaging system (for example, inserted into a slot of a patient bed), a control unit of the magnetic resonance imaging system may acquire respective type information (e.g., type 1 and type 2) from the local coil group 3 and the local coil group 4. A switch 11 may acquire type information about each local coil from the control unit, and determine a digital processing channel corresponding to the local coil based on type information about the local coil and a radio frequency signal output port corresponding to the local coil.

In FIG. 2, the receiver 1 includes two paths of digital processing channels connected to a first stage amplifier 13 and two paths of digital processing channels connected to a first stage amplifier 15. In fact, the receiver 1 may further contain more digital processing channels, and this is not limited in the embodiments.

An input end of the first stage amplifier 13 is an input end of the receiver 1, which connects to an output port A of the receiving coil channel selector 5. The output port A of the receiving coil channel selector 5 is taken as an example for explanation hereinafter.

The output port A of the receiving coil channel selector 5 is connected to an input end of the first stage amplifier 13, and the first stage amplifier 13 is used for performing first stage amplification on an analog magnetic resonance signal received from the local coil group 3 or the local coil group 4 via the output port A of the receiving coil channel selector 5.

When the switch 11 judges that the analog magnetic resonance signal input via the output port A is from a local coil of type 1, a contact S1 is connected, and the analog magnetic resonance signal after first stage amplification successively passes through a second stage amplifier 21, a band pass filter 22, a switch 24 (e.g., at this moment, a contact S3 is kept closed) and an A/D converter 25. Besides, the A/D converter 25 digitizes the analog magnetic resonance signal so as to convert the analog magnetic resonance signal into a digital magnetic resonance signal.

The digital magnetic resonance signal enters a down-conversion unit 6. A digital band pass filter 31 and an extraction operator 32 in the down-conversion unit 6 respectively perform digital band pass filtering and extraction operations so as to reduce the frequency of the digital magnetic resonance signal, and a final digital magnetic resonance signal Dig_CH1 is obtained through a frequency mixer 44. At this moment, the second stage amplifier 21, the band pass filter 22, the switch 24 (e.g., the contact S3 is kept closed), the A/D converter 25, the digital band pass filter 31, the extraction operator 32 and the frequency mixer 44 constitute a digital processing channel.

When the switch 11 judges that the analog magnetic resonance signal (e.g., the analog magnetic resonance signal being formed by the combination of two paths of analog magnetic resonance signals in the local coil group 4) input via the output port A is from a local coil of type 2, a contact S2 is connected, and the analog magnetic resonance signal after first stage amplification successively passes through a low pass filter 23, the switch 24 (e.g., at this moment, a contact S4 is kept closed) and the A/D converter 25. The A/D converter 25 digitizes the analog magnetic resonance signal so as to convert the analog magnetic resonance signal into a digital magnetic resonance signal.

The digital magnetic resonance signal enters a down-conversion unit 6. The digital magnetic resonance signal practically contains two paths of signals, and the two paths of signals have different frequencies, respectively corresponding to two paths of analog magnetic resonance signals combined in the local coil group 4.

Accordingly, the down-conversion unit 6 has two paths. A first path is used for processing a signal with a high frequency. In the first path, the digital band pass filter 31 and the extraction operator 32 respectively perform digital band pass filtering and extraction operations so as to reduce the frequency of the first path of digital magnetic resonance signal, and a first path of final digital magnetic resonance signal Dig_CH1 is obtained through the frequency mixer 44. A second path is used for processing a signal with a low frequency. In the second path, the digital band pass filter 41 and the extraction operator 42 respectively perform digital band pass filtering and extraction operations so as to reduce the frequency of the second path of digital magnetic resonance signal, and a second path of final digital magnetic resonance signal Dig_CH2 is obtained. At this moment, the low pass filter 23, the switch 24 (e.g., the contact S4 is kept closed), the A/D converter 25, the digital band pass filter 31, the extraction operator 32, the frequency mixer 44, the digital band pass filter 41 and the extraction operator 42 constitute a digital processing channel. Each path of the digital magnetic resonance signal is then sent to an image reconstruction apparatus of the magnetic resonance imaging system via an output end.

Similarly, a switch 12 has the same function as the switch 11. Two paths of digital processing channels connected to the first stage amplifier 15 also have a similar processing mechanism.

It may be seen that first amplification and secondary amplification are respectively performed on an analog magnetic resonance signal of a reception coil of type 1 at a receiver 1 side so as to compensate large attenuation in the transmission process of radio frequency signals well. Besides, for an analog magnetic resonance signal of a reception coil of type 2, the receiver 1 need not perform secondary amplification, but directly performs filtering via a low pass filter.

Besides, for an analog magnetic resonance signal of a local coil of type 2 (e.g., combined with two paths of analog magnetic resonance signals of two local coils), the embodiments perform signal separation after performing digitization processing instead of performing signal separation in an analog stage so as to reduce the cost of an analog circuit.

In addition, the embodiments may further reduce the amount of digital processing channels by multiplexing an element. For example, in the prior art, if there are 16 local coils of type 2, then 16 digital processing channels are needed; however, the embodiments merely need 8 digital processing channels.

Figure 3:
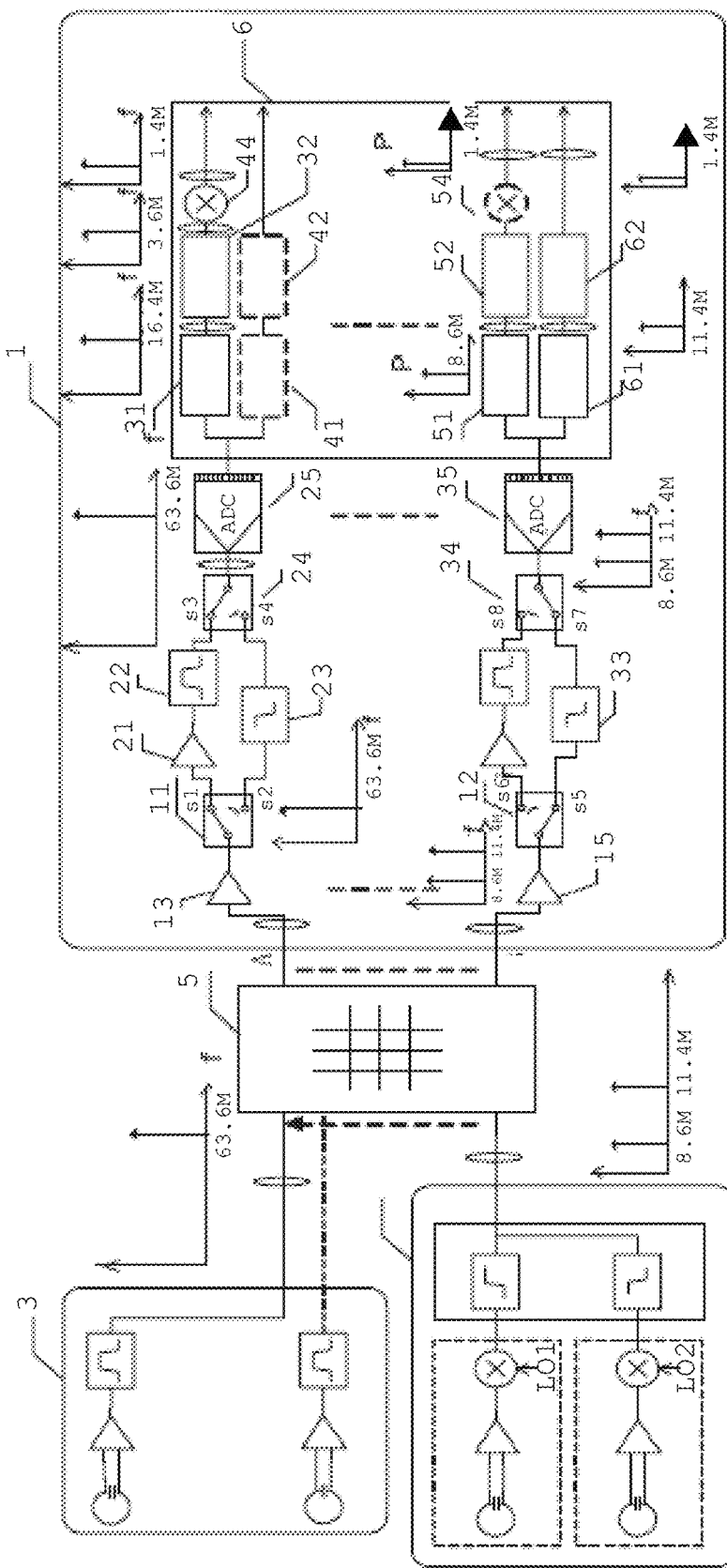
FIG. 3 is a structural diagram of a receiver of a 1.5T magnetic resonance imaging system according to the first embodiment.

Based on the above-mentioned analysis, FIG. 3 is a structure diagram of a receiver of a 1.5T magnetic resonance imaging system according to the first embodiment.

As depicted in FIG. 3, a local coil group 3 contains a plurality of local coils, and these local coils are of the same type and do not all contain a frequency mixing processing unit, and analog magnetic resonance signals output by these local coils are all in radio frequency (RF), assuming that the type of each local coil in the local coil group 3 is type 1. Besides, the frequency of an analog magnetic resonance signal of a local coil of type 1 is 63.6 MHz.

Besides, a local coil group 4 contains two local coils, and these local coils are of the same type and all contain a frequency mixing processing unit, and each frequency mixing processing unit respectively has a local oscillator signal input LO. The analog magnetic resonance signal of each local coil in the local coil group 4 is respectively frequency-mixed into an intermediate frequency (IF) by the frequency mixing unit. An analog magnetic resonance signal received by each single coil of a local coil of type 2 is 63.6 MHz, and a local oscillator signal of a frequency mixing unit is respectively 55 MHz and 75 MHz, and therefore, the frequencies of two paths of obtained intermediate frequency analog magnetic resonance signals are respectively 8.6 MHz and 11.4 MHz.

Besides, the intermediate frequency analog magnetic resonance signals (e.g., an analog magnetic resonance signal of 8.6 MHz and an analog magnetic resonance signal of 11.4 MHz) of two local coils in the local coil group 4 are combined into a path of analog magnetic resonance signal, and the combined analog magnetic resonance signal is output to a coil channel selector 5. Assume that the type of each local coil in the local coil group 4 is type 2.

The local coil group 3 and the local coil group 4 are respectively connected to an input port of the receiving coil channel selector 5. A radio frequency signal output port is allocated for each local coil in the local coil group 3 and the local coil group 4 by the receiving coil channel selector 5. The radio frequency signal output port corresponds to the local coil.

When the local coil group 3 and the local coil group 4 are connected to a magnetic resonance imaging system (for example, inserted into a slot of a patient bed), a control unit of the magnetic resonance imaging system may acquire respective type information (e.g., type 1 and type 2) from the local coil group 3 and the local coil group 4. The switch 11 and switch 12 may acquire type information about each local coil from the control unit, and determine a digital processing channel corresponding to the local coil based on type information about the local coil and a radio frequency signal output port corresponding to the local coil.

In FIG. 3, the receiver 1 includes two paths of digital processing channels connected to a first stage amplifier 13 and two paths of digital processing channels connected to a first stage amplifier 15. In fact, the receiver 1 may further contain more digital processing channels, and this is not limited in the embodiments.

An input end of the first stage amplifier 13 is an input end of the receiver 1, which connects to an output port A of the receiving coil channel selector 5. The output port A of the receiving coil channel selector 5 is taken as an example for explanation hereinafter.

Assuming that the local coil group 3 corresponds to the output port A of the receiving coil channel selector 5, the output port A of the receiving coil channel selector 5 is connected to the input end of the first stage amplifier 13, and the first stage amplifier 13 is used for performing first stage amplification on an analog magnetic resonance signal (63.6 MHz) received from the local coil group 3 by the receiving coil channel selector.

When the switch 11 judges that the input analog magnetic resonance signal is from a local coil of type 1, a contact S1 is connected, and the analog magnetic resonance signal after first stage amplification successively passes through a second stage amplifier 21, a band pass filter 22, a switch 24 (e.g., at this moment, a contact S3 is kept closed) and an A/D converter 25. The A/D converter 25 digitizes the analog magnetic resonance signal so as to convert the analog magnetic resonance signal into a digital magnetic resonance signal. The digital magnetic resonance signal enters a down-conversion unit 6. A digital band pass filter 31 and an extraction operator 32 in the down-conversion unit 6 respectively perform digital band pass filtering and extraction operations so as to reduce the frequency of the digital magnetic resonance signal, and a final digital magnetic resonance signal Dig_CH1 is obtained through a frequency mixer. The frequency after digital band pass filtering is 16.4 MHz, and the frequency after the extraction operation is 3.6 MHz, and the frequency of the Dig_CH1 output by the frequency mixer is 1.4 MHz. Each path of the digital magnetic resonance signal is sent to an image reconstruction apparatus of the magnetic resonance imaging system via an output end.

Assuming that the local coil group 4 corresponds to the output port B of the receiving coil channel selector 5, an input end of the first stage amplifier 15 is connected to the output port B of the receiving coil channel selector 5.

When the switch 12 judges that the input analog magnetic resonance signal is from a local coil of type 2, a contact S5 is connected, and the analog magnetic resonance signal after first stage amplification successively passes through a low pass filter 33, a switch 34 (e.g., at this moment, a contact S7 is kept closed) and an A/D converter 35. The A/D converter 35 digitizes the analog magnetic resonance signal to a digital magnetic resonance signal. The digital magnetic resonance signal enters a down-conversion unit 6. The digital magnetic resonance signal practically contains two paths of signals, and the two paths of signals have different frequencies (e.g., 8.6 MHz and 11.4 MHz), and correspond to two paths of analog magnetic resonance signals combined in the local coil group 4.

Accordingly, the down-conversion unit 6 has two paths. A first path is used for processing a signal with a high frequency (e.g., 11.4 MHz). In the first path, a digital band pass filter 51 and an extraction operator 52 respectively perform digital band pass filtering and extraction operations so as to reduce the frequency of the first path of the digital magnetic resonance signal, and a final digital magnetic resonance signal is obtained through the frequency mixer 54, and the frequency of the digital magnetic resonance signal output is 1.4 MHz. A second path is used for processing a signal with a low frequency. In the second path, a digital band pass filter 61 and an extraction operator 62 respectively perform digital band pass filtering and extraction operations so as to reduce the frequency of the second path of the digital magnetic resonance signal, and a second path of final digital magnetic resonance signal is obtained, and the frequency of the digital magnetic resonance signal output is 1.4 MHz.

It may be seen that first amplification and secondary amplification are respectively performed on an analog magnetic resonance signal of a reception coil of type 1 at a receiver side so as to compensate large attenuation in the transmission process of radio frequency signals well. Besides, for an analog magnetic resonance signal from a reception coil of type 2, there is no need to perform secondary amplification, and filtering is directly performed by a low pass filter.

Besides, for an analog magnetic resonance signal of a local coil of type 2 (e.g., combined with two paths of analog magnetic resonance signals of two local coils), the embodiments perform signal separation after performing digitization processing instead of performing signal separation in an analog stage so as to reduce the cost of an analog circuit.

Figure 4:
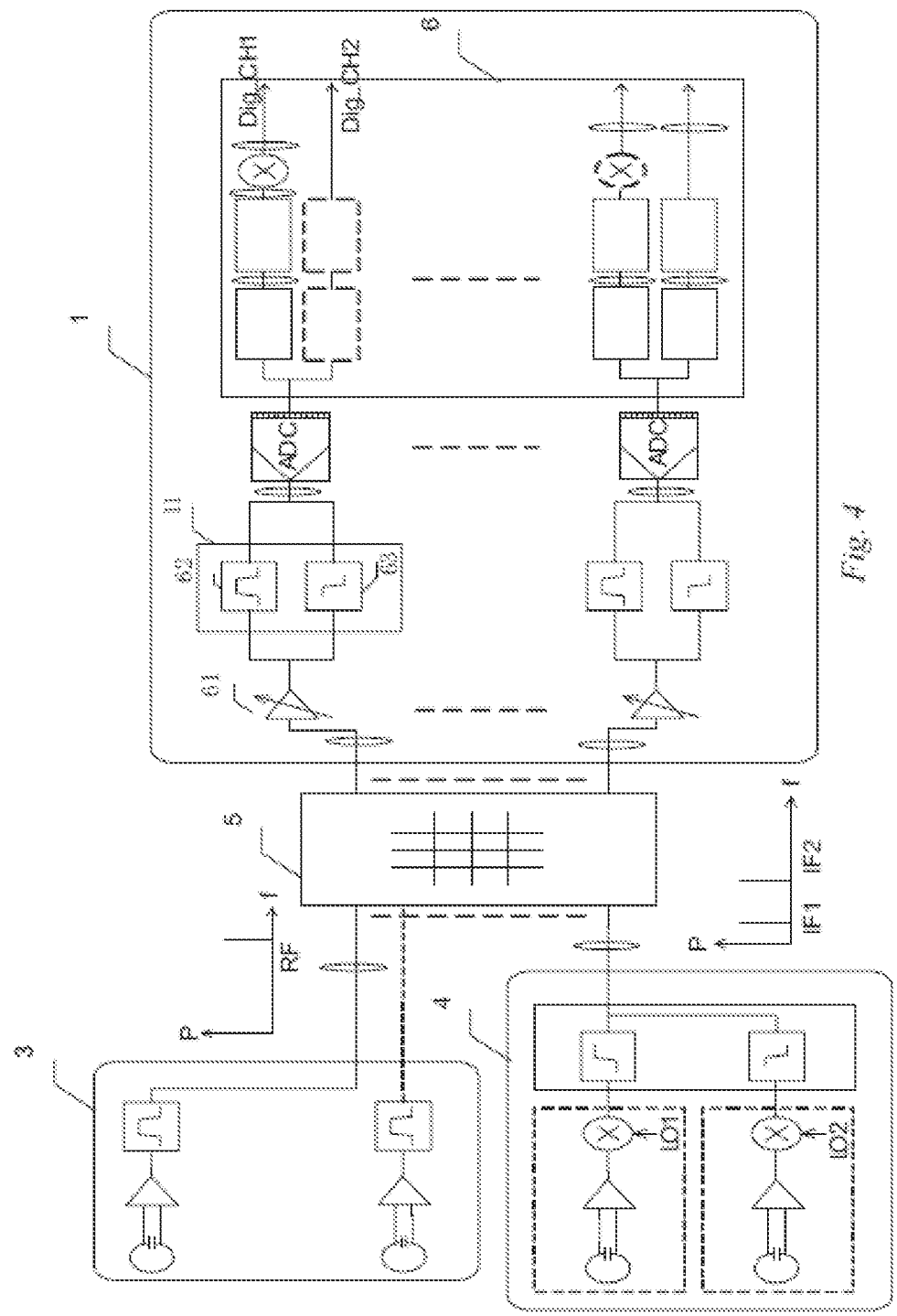
FIG. 4 is a structural diagram of a receiver of a magnetic resonance imaging system according to a second embodiment.

FIG. 4 is a structure diagram of a receiver of a magnetic resonance imaging system according to a second embodiment.

It may be seen from FIG. 4 that a local coil group 3 contains a plurality of local coils, and these local coils are of the same type and do not all contain a frequency mixing processing unit, and analog magnetic resonance signals output by these local coils are all in radio frequency (RF), assuming that the type of each local coil in the local coil group 3 is type 1.

Besides, a local coil group 4 contains a plurality of local coils, and these local coils are of the same type and all contain a frequency mixing processing unit, and each frequency mixing processing unit respectively has a local oscillator signal input LO. The respective analog magnetic resonance signal of each local coil in the local coil group 4 is respectively frequency-mixed into an intermediate frequency (IF) by a frequency mixing unit. Besides, the respective intermediate frequency analog magnetic resonance signals of the plurality of local coils in the local coil group 4 are combined into a path of the analog magnetic resonance signal, and the combined analog magnetic resonance signal is output to a coil channel selector 5, assuming that the type of each local coil in the local coil group 4 is type 2.

The local coil group 3 and the local coil group 4 are respectively connected to an input port of the receiving coil channel selector 5. A radio frequency signal output port is allocated for each local coil in the local coil group 3 and the local coil group 4 by the receiving coil channel selector 5. The radio frequency signal output port corresponds to the local coil.

When the local coil group 3 and the local coil group 4 are connected to a magnetic resonance imaging system (for example, inserted into a slot of a patient bed), a control unit of the magnetic resonance imaging system may acquire respective type information (e.g., type 1 and type 2) from the local coil group 3 and the local coil group 4. An adjustable gain amplifier 61 may acquire type information about each local coil from the control unit, and determine a corresponding gain coefficient based on type information about the local coil and a radio frequency signal output port corresponding to the local coil.

In FIG. 4, a band pass filter 62 and a low pass filter 63 connected in parallel together constitute the channel selection unit 11.

When the channel selection unit 11 judges that an analog magnetic resonance signal input via the output port A is from a local coil of type 1, an allowed certain frequency band of the band pass filter 62 is increased so that the analog magnetic resonance signal may pass through the band pass filter 62 instead of passing through the low pass filter 63. When the channel selection unit 11 judges that an analog magnetic resonance signal input via the output port A is from a local coil of type 2, an allowed certain frequency band of the low pass filter 63 is lowered so that the analog magnetic resonance signal may pass through the low pass filter 63 instead of passing through the band pass filter 62.

Based on the above-mentioned detailed analysis, the embodiments further propose a reception method for a magnetic resonance signal of a magnetic resonance imaging system.

Figure 5:
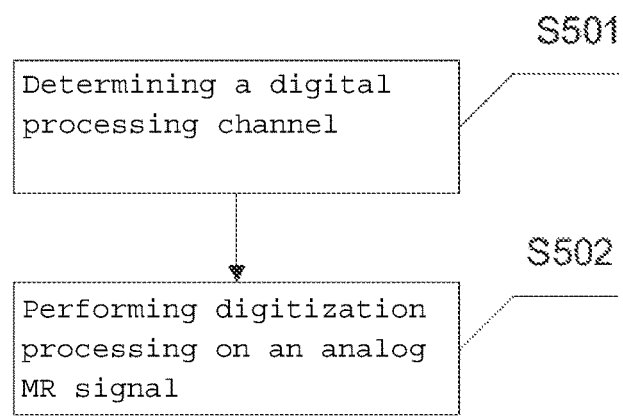
FIG. 5 is a flowchart of one embodiment of a reception method for a magnetic resonance signal of a magnetic resonance imaging system.

FIG. 5 is a flowchart of a reception method for a magnetic resonance signal of a magnetic resonance imaging system according to the embodiments.

As depicted in FIG. 5, the method includes act S501, wherein a digital processing channel is determined from at least one digital processing channel according to type information about a local coil. In act S502, the determined digital processing channel performs digitization processing on an analog magnetic resonance signal received from the local coil.

In one embodiment, the method further includes acquiring type information from a control unit of the magnetic resonance imaging system.

It is to be noted that not all of the acts and modules in each of the above-mentioned flowchart and structural diagrams are necessary, and it is possible to ignore certain acts or modules according to practical needs. The execution sequence of each act is not fixed and may be adjusted as needed. The division of each module is functional division merely for convenience of description, and when it is implemented practically, a module may be realized separately by a plurality of modules, and the functions of a plurality of modules may also be realized by the same module, and these modules may be located in the same device, and may also be located in different devices.

A hardware module in each embodiment may be realized in a mechanical manner or electrical manner. For example, a hardware module may include a specially designed permanent circuit or logical device (such as a special-purpose processor, such as FPGA or ASIC) for completing certain operations. The hardware module may also comprise a programmable logic device or circuit (such as including a general processor or other programmable processors) temporarily configured by software for performing certain operations. As regards particularly using the mechanical manner, or using a special-purpose permanent circuit or using a temporarily configured circuit (such as being configured by software) to realize the hardware module, it may be determined according to considerations of cost and time.

The present embodiments also provide a machine-readable storage medium that stores instructions for making a machine perform the method as described herein. Particularly, a system or an apparatus equipped with a storage medium may be provided, on which storage medium there are stored software program codes for implementing the functions of any of the above-mentioned embodiments, and a computer (e.g., either CPU or MPU) of the system or apparatus may read and execute the program codes stored in the storage medium. In addition, an operating system operating on the computer may complete part of or all of the practical operations by instructions based on program codes. The program codes read from the storage medium may also be written into a memory provided in an extension board inserted inside the computer or into a memory provided in an extension unit connected to the computer. Subsequently, the instructions based on the program codes cause the CPU mounted on the extension board or the extension unit to perform part of or all of the practical operations, thereby realizing the function of any one of the above-mentioned embodiments.

The embodiments of the storage medium for providing program codes include a floppy disk, a hard disk, a magnetic optical disk, an optical disk (such as CD-ROM, CD-R, CD-RW, DVD-ROM, DVD-RAM, DVD-RW, and DVD+RW), a magnetic tape, a non-volatility storage card, and a ROM. Selectively, the program codes may be downloaded from a server computer via a communication network.

To sum up, the receiver of the magnetic resonance imaging system of the embodiments includes a receiving end for receiving an analog magnetic resonance signal from a local coil of the magnetic resonance imaging system, a sending end for sending a digital magnetic resonance signal to an image reconstruction apparatus of the magnetic resonance imaging system, at least two digital processing channels connected to the sending end for digitizing the analog magnetic resonance signal to the digital magnetic resonance signal, and a channel selection unit connected between the digital processing channels and the receiving end for selecting a corresponding digital processing channel from the digital processing channels according to type information about the local coil. It may be seen that after the embodiments are applied, many types of local coils may be compatible without re-designing the local coils, which significantly reduces the cost of the system.

Besides, the embodiments respectively perform first amplification and secondary amplification on an analog magnetic resonance signal of a reception coil of type 1 at a receiver side so as to compensate large attenuation in the transmission process of radio frequency signals well.

Besides, for an analog magnetic resonance signal of a local coil of type 2, the embodiments perform signal separation after performing digitization processing instead of performing signal separation in an analog stage so as to reduce the cost of an analog circuit.

In addition, the embodiments may further reduce the amount of digital processing channels by multiplexing an element.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A receiver of a magnetic resonance imaging system, comprising:
    a receiving end for receiving a plurality of analog magnetic resonance signals from a local coil of the magnetic resonance imaging system;
    a sending end for sending digital magnetic resonance signals to an image reconstruction apparatus of the magnetic resonance imaging system;
    at least two digital processing channels connected to the sending end for digitizing the plurality of analog magnetic resonance signals to the digital magnetic resonance signals, wherein the at least two digital processing channels comprise a radio frequency digital processing channel and an intermediate frequency signal digital processing channel; and
    a channel selection unit connected between the at least two digital processing channels and the receiving end for selecting a corresponding digital processing channel from the at least two digital processing channels according to type information about the local coil, wherein the channel selection unit comprises a band pass filter connected to the radio frequency signal digital processing channel and a low pass filter connected to the intermediate frequency signal digital processing channel.

2. The receiver as claimed in claim 1, wherein the channel selection unit is further connected to a control unit of the magnetic resonance imaging system for acquiring the type information from the control unit.

3. The receiver as claimed in claim 2, further comprising:
    a gain adjustable amplifier for amplifying the plurality of analog magnetic resonance signals.

4. The receiver as claimed in claim 1, wherein the channel selection unit comprises a toggle switch, and the toggle switch turns on the corresponding digital processing channel according to the type information.

5. The receiver as claimed in claim 4, further comprising:
    a gain adjustable amplifier for amplifying the plurality of analog magnetic resonance signals.

6. The receiver as claimed in claim 1, further comprising:
    a gain adjustable amplifier for amplifying the plurality of analog magnetic resonance signals.

7. The receiver as claimed in claim 6, wherein the gain adjustable amplifier is connected between the receiving end and the channel selection unit.

8. The receiver as claimed in claim 6, wherein the gain adjustable amplifier is configured to adjust a gain coefficient of the gain adjustable amplifier according to the type information.

9. The receiver as claimed in claim 8, wherein the gain adjustable amplifier is connected to a control unit of the magnetic resonance imaging system for acquiring the type information from the control unit.

10. A magnetic resonance imaging system, comprising:
    a local coil;
    an image reconstruction apparatus;
    a control unit configured to acquire type information from the local coil; and
    a receiver comprising:
        a receiving end for receiving a plurality of analog magnetic resonance signals from the local coil;
        a sending end for sending digital magnetic resonance signals to the image reconstruction apparatus;
        at least two digital processing channels connected to the sending end for digitizing the plurality of analog magnetic resonance signals to the digital magnetic resonance signals, wherein the at least two digital processing channels comprise a radio frequency digital processing channel and an intermediate frequency signal digital processing channel; and
        a channel selection unit connected between the at least two digital processing channels and the receiving end for selecting a corresponding digital processing channel from the at least two digital processing channels according to the type information about the local coil, wherein the channel selection unit comprises a band pass filter connected to the radio frequency signal digital processing channel and a low pass filter connected to the intermediate frequency signal digital processing channel.

11. The magnetic resonance imaging system as claimed in claim 10, wherein the receiver further comprises a gain adjustable amplifier for amplifying the plurality of analog magnetic resonance signals.

12. The magnetic resonance imaging system as claimed in claim 11, wherein the gain adjustable amplifier is connected to the control unit.

13. The magnetic resonance imaging system as claimed in claim 12, wherein the gain adjustable amplifier is connected between the receiving end and the channel selection unit.

14. The magnetic resonance imaging system as claimed in claim 11, wherein the gain adjustable amplifier is configured to adjust a gain coefficient of the gain adjustable amplifier according to the type information.

15. The magnetic resonance imaging system as claimed in claim 11, wherein the gain adjustable amplifier is connected to a control unit of the magnetic resonance imaging system for acquiring the type information from the control unit.

* * * * *